(12) United States Patent
Nguyen (10) Patent No.: US 6,960,937 B1
(45) Date of Patent: Nov. 1, 2005

(54) POWER-UP AND ENABLE CONTROL CIRCUITS FOR INTERCONNECTION ARRAYS IN PROGRAMMABLE LOGIC DEVICES

(75) Inventor: Andy T. Nguyen, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 35 days.

(21) Appl. No.: 10/977,566

(22) Filed: Oct. 29, 2004

Related U.S. Application Data (62) Division of application No. 10/391,210, filed on Mar. 14, 2003, now Pat. No. 6,831,481.

(51) Int. Cl.[7] .............. H03K 19/02; H03K 19/094
(52) U.S. Cl. .................................... 326/58; 326/83
(58) Field of Search ................. 326/56–58, 81–83, 326/86–87; 327/108

(56) References Cited

U.S. PATENT DOCUMENTS 5,682,110 A * 10/1997 Rountree .................... 327/108
5,929,654 A * 7/1999 Park et al. ..................... 326/58
6,163,169 A    12/2000 Lawson
6,496,045 B1  12/2002 Nguyen

* cited by examiner

Primary Examiner—James H. Cho
(74) Attorney, Agent, or Firm—Lois D. Cartier (57) ABSTRACT

Area-efficient power-up and enable control circuits useful in PLD interconnection arrays. A control circuit can include a driver circuit, first and second pull-ups, and first and second pull-downs. The driver circuit has an output terminal coupled to a control circuit output terminal. The first and second pull-ups are coupled in series between the control circuit output terminal and power high. The first pull-up has a gate terminal coupled to an enable terminal. The second pull-up has a gate terminal coupled to a pull-up control terminal. The first and second pull-downs are coupled in parallel between the control circuit output terminal and ground. The first pull-down has a gate terminal coupled to the enable terminal. The second pull-down has a gate terminal coupled to a pull-down control terminal. In other embodiments, the first and second pull-ups are coupled in parallel, and the first and second pull-downs are coupled in series.

11 Claims, 8 Drawing Sheets

POWER-UP AND ENABLE CONTROL CIRCUITS FOR INTERCONNECTION ARRAYS IN PROGRAMMABLE LOGIC DEVICES

FIELD OF THE INVENTION

The invention relates to Programmable Logic Devices (PLDs). More particularly, the invention relates to power-up and enable control circuits for interconnection arrays in PLDs.

BACKGROUND OF THE INVENTION

Figure 1:
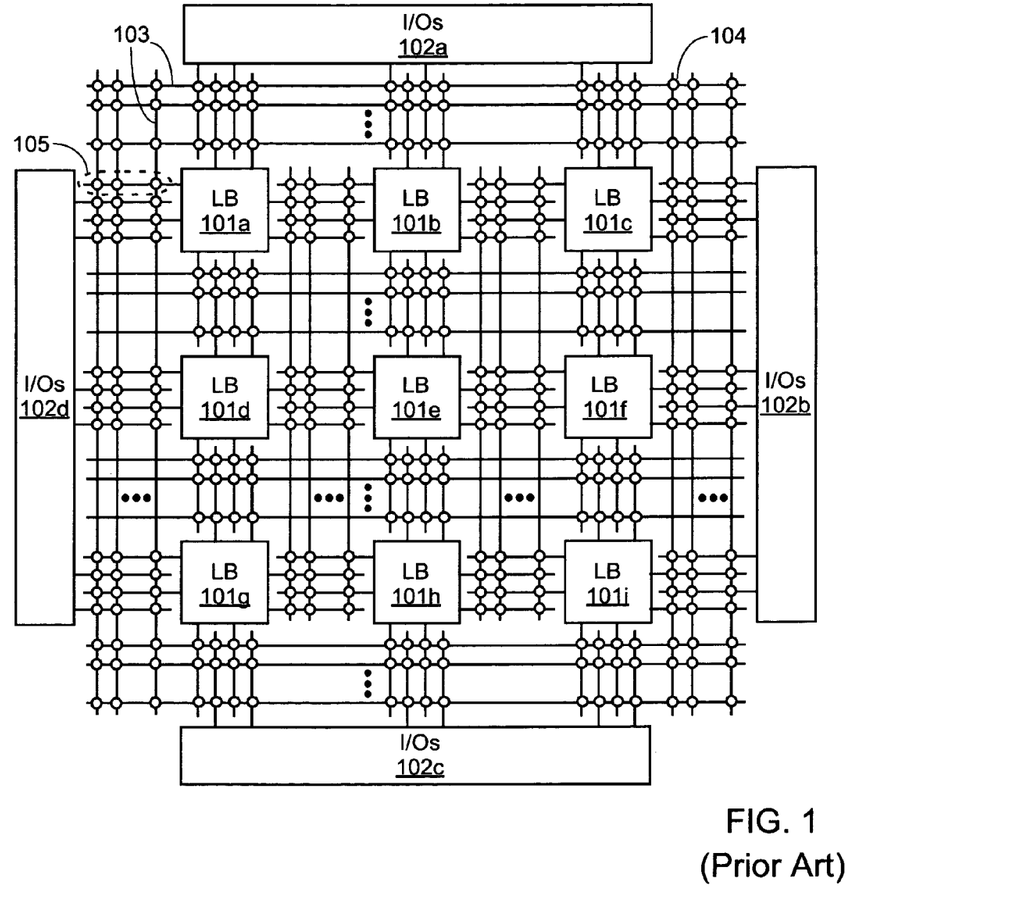
FIG. 1 shows a prior art field programmable gate array (FPGA).

Programmable logic devices (PLDs) are a well-known type of digital integrated circuit that can be programmed to perform specified logic functions. FIG. 1 is a simplified illustration of one type of PLD, the Field Programmable Gate Array (FPGA). An FPGA typically includes an array of configurable logic blocks (LBs 101a–101i) and programmable input/output blocks (I/Os 102a–102d). The LBs and I/O blocks are interconnected by a programmable interconnection array that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. Some FPGAs also include additional logic blocks with special purposes (not shown), e.g., DLLs, RAM, and so forth.

The interconnection array, LBs, I/O blocks, and other logic blocks are typically programmed by loading a stream of configuration data into internal configuration memory cells that define how the interconnection array and logic blocks are configured. The configuration data can be read from memory (e.g., from an external PROM) or written into the FPGA by an external device. The collective states of the individual memory cells then determine the function of the FPGA.

Figure 2:
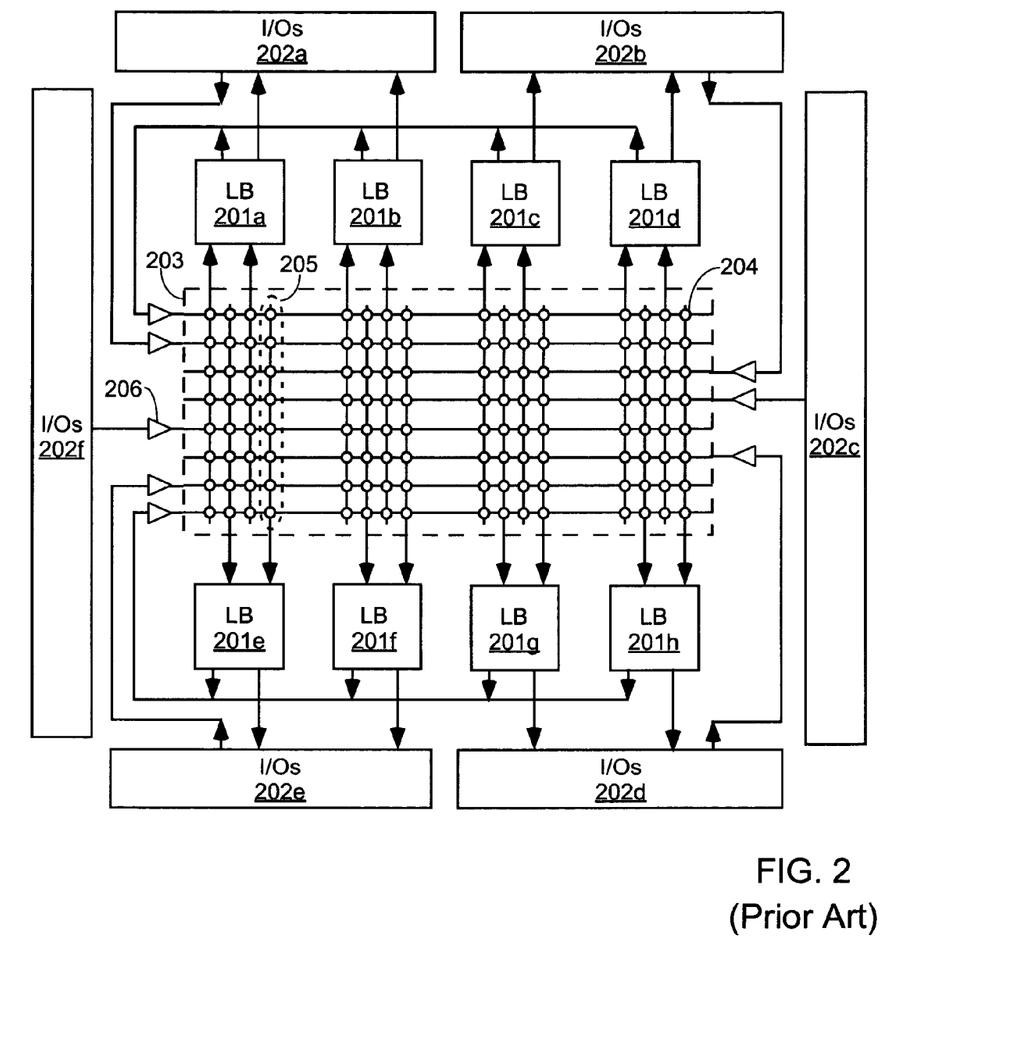
FIG. 2 shows a prior art complex programmable logic device (CPLD).

FIG. 2 is a simplified illustration of another type of PLD called the Complex Programmable Logic Device, or CPLD. A CPLD includes two or more logic blocks (LBs 201a–201h) connected together and to input/output blocks (I/Os 202a–202f) by a programmable interconnection array (203). Each logic block of the CPLD includes a two-level AND/OR structure similar to those used in Programmable Logic Arrays (PLAs) and Programmable Array Logic (PAL) devices. The interconnection array includes many multiplexer circuits 205, each including several PIPs 204. In each multiplexer circuit 205, only one PIP 204 is enabled. The enabled PIP selects one of the many input signals provided to the interconnection array, and the selected input signal is provided as the output signal from the multiplexer circuit 205.

In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static RAM cells, as in FPGAs and some CPLDs), in non-volatile memory (e.g., FLASH memory, as in some CPLDs), or in any other type of memory cell.

Figure 3:
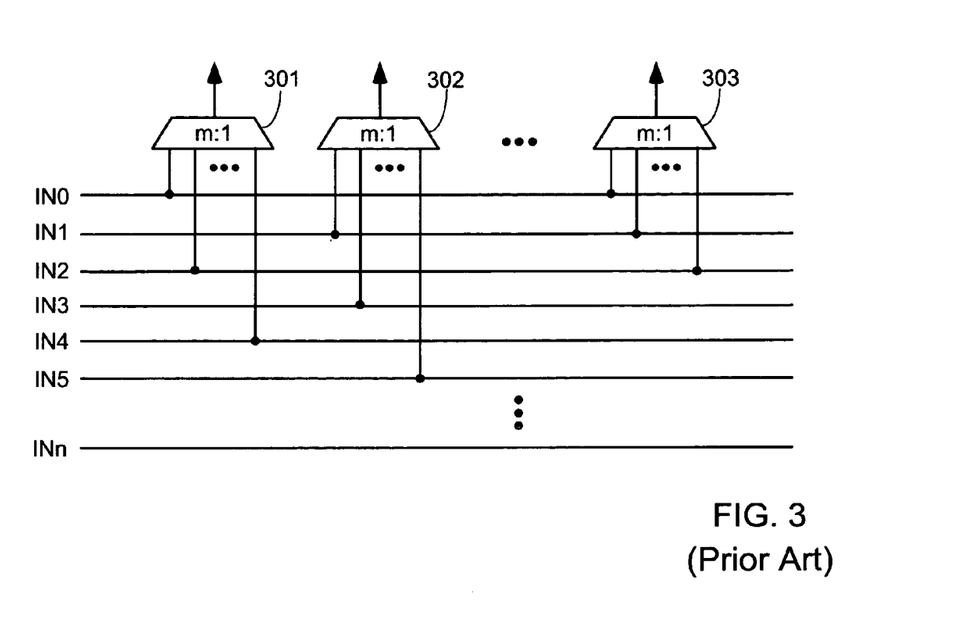
FIG. 3 is a simplified illustration of a portion of an interconnection array in a programmable logic device (PLD) such as an FPGA or a CPLD.

PLD interconnection arrays typically include large numbers of multiplexer circuits that implement the programmable paths between the logic blocks. FIG. 3 illustrates several of these multiplexer circuits 301–303, selecting from among the signals on interconnect lines IN0–INn. (In the present specification, the same reference characters are used to refer to terminals, signal lines, and their corresponding signals.)

In many PLD applications, large numbers of these multiplexer circuits (and the resources driven by the multiplexer circuits) are not used even when the PLD is configured. Thus, to prevent floating nodes from occurring in a configured PLD, it is desirable for unused multiplexer circuits to provide a known value of either one (power high) or zero (ground). Further, after power-up but prior to configuration of the PLD, the multiplexer circuits preferably also provide a known value. Finally, some known multiplexer circuits also accept an enable signal, which either enables the circuit, or, alternatively, disables the circuit by forcing the multiplexer output signal to a known value. This enable signal allows the multiplexer circuits to be disabled during power-up, for example. Thus, multiplexer circuits in PLD interconnection arrays often include power-up and enable control circuits to provide some or all of these functions.

Figure 4:
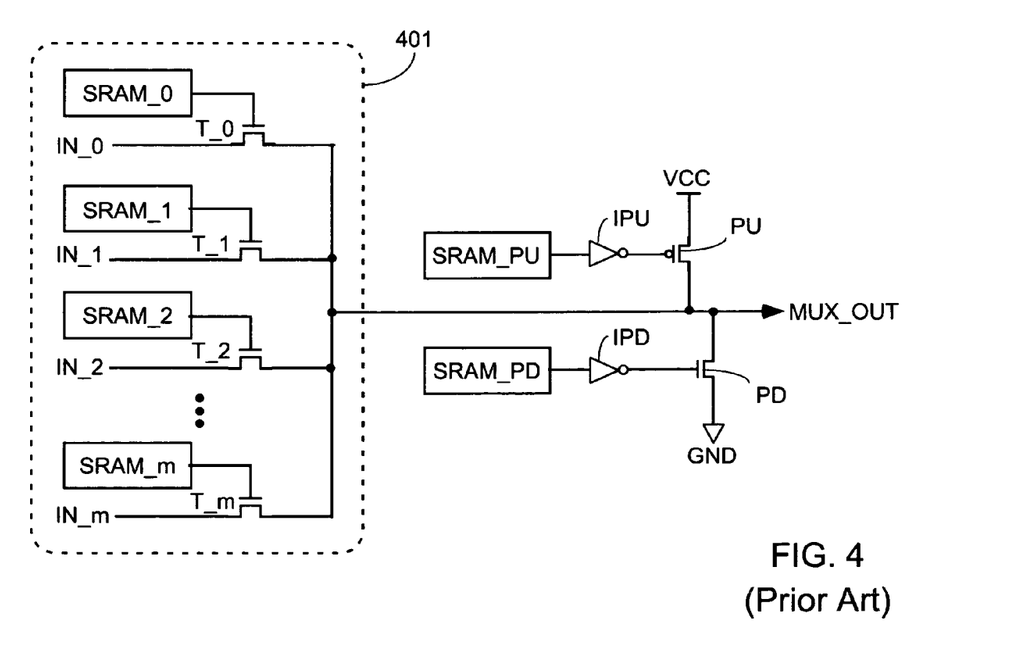
FIG. 4 shows a first known power-up control circuit that can be used in a PLD interconnection array.

FIG. 4 is a schematic diagram of a known power-up control circuit that can be used in a PLD interconnection array. The control circuit of FIG. 4 includes a multiplexer circuit 401. The contents of memory cells SRAM_0–SRAM_m control transistors T_0–T_m to select one of the input signals IN_0–IN_m, and to place the selected signal on output terminal MUX_OUT. Coupled between output terminal MUX_OUT and power high VCC is a pull-up PU. A configuration memory cell SRAM_PU drives inverter IPU, which in turn controls pull-up PU. Coupled between output terminal MUX_OUT and ground GND is a pull-down PD. A configuration memory cell SRAM_PD drives inverter IPD, which in turn controls pull-down PD.

The control circuit of FIG. 4 functions as shown in Table 1.

TABLE 1

| SRAM_PU | SRAM_PD | SRAM_0 | SRAM_1 | SRAM_2 | SRAM_m | MUX_OUT |
|---|---|---|---|---|---|---|
| 0 | 0 | 0 | 0 | 0 | 0 | 0 (blank device) |
| 1 | 1 | 0 | 0 | 0 | 0 | 1 |
| 0 | 0 | 0 | 0 | 0 | 0 | 0 |
| 0 | 1 | 1 | 0 | 0 | 0 | in_0 |

TABLE 1-continued

| SRAM_PU | SRAM_PD | SRAM_0 | SRAM_1 | SRAM_2 | SRAM_m | MUX_OUT |
|---|---|---|---|---|---|---|
| 0 | 1 | 0 | 1 | 0 | 0 | in_1 |
| 0 | 1 | 0 | 0 | 1 | 0 | in_2 |
| 0 | 1 | 0 | 0 | 0 | 1 | in_m |

In this example, in a blank (unconfigured) device, the contents of all memory cells are zero. Thus, pull-up PU is disabled, and pull-down PD is enabled, pulling output terminal MUX_OUT low. An output terminal that is low by default is generally preferred for a control circuit in a PLD interconnection array, because configuration of the PLD can occur at very low values of power high VCC. Further, to reduce die size both pull-up PU and pull-down PD are preferably minimum-sized devices. Because an N-channel transistor has a lower resistance than a similarly-sized P-channel transistor, pull-down PD is generally faster than pull-up PU. Therefore, the initialization process takes place more rapidly when the default or blank value is zero.

As previously described, typically in a blank PLD all memory cells store zero (low) values. However, as power is first applied to the PLD (i.e., during "power-up") the memory cells can "wake up" in either state. Therefore, when the circuit of FIG. 4 is used, during power-up some control circuits are driving high values while others are driving low values. Contention can occur, with the consequent undesirable current flow and even, potentially, resulting damage to the PLD. Therefore, an enable signal is often provided to disable the control circuit until after power-up, as in the circuit of FIG. 5.

Figure 5:
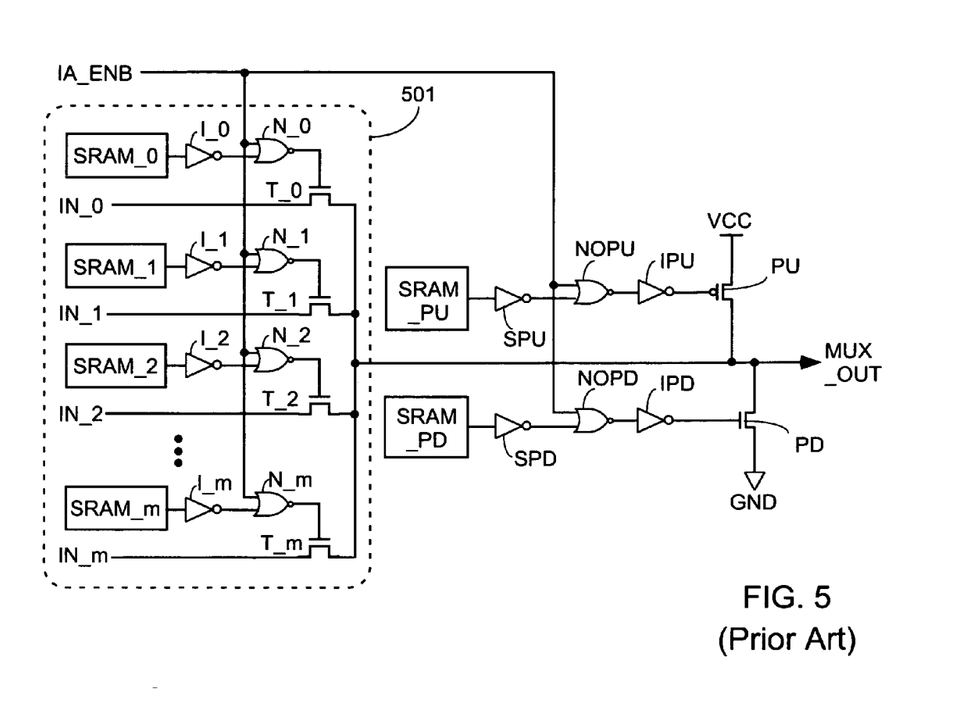
FIG. 5 shows a second known power-up and enable control circuit that can be used in a PLD interconnection array.

The power-up and enable control circuit of FIG. 5 includes an enable terminal IA_ENB. When signal IA_ENB is high (e.g., during power-up), output signal MUX_OUT is forced low. When signal IA_ENB is low (e.g., after power-up is complete), the memory cells control the operation of the circuit as described in connection with the circuit of FIG. 4.

The control circuit of FIG. 5 includes a multiplexer circuit 501, which includes memory cells SRAM_0–SRAM_m, inverters I_0–I_m, NOR gates N_0–N_m, and transistors T_0–T_m. When enable signal IA_ENB is low, the contents of memory cells SRAM_0–SRAM_m control transistors T_0–T_m to select one of the input signals IN_0–IN_m, and to place the selected signal on output terminal MUX_OUT. When enable signal IA_ENB is high, all of transistors T_0–T_m are disabled (off), and multiplexer circuit 501 does not drive circuit output terminal MUX_OUT.

Coupled between output terminal MUX_OUT and power high VCC is a pull-up PU. A configuration memory cell SRAM_PU drives inverter SPU, which, when enable signal IA_ENB is low, controls pull-up PU through NOR gate NOPU and inverter IPU. When enable signal IA_ENB is high, pull-up PU is off. Coupled between output terminal MUX_OUT and ground GND is a pull-down PD. A configuration memory cell SRAM_PD drives inverter SPD, which, when enable signal IA_ENB is low, controls pull-down PD through NOR gate NOPD and inverter IPD. When enable signal IA_ENB is high, pull-down PD is on.

The control circuit of FIG. 5 functions as shown in Table 2. In Table 2 (and in the other tables herein), an "X" entry denotes a "don't care" value, while an entry of "IN_#" means that the value on output terminal MUX_OUT is provided by the driver circuit (in FIG. 5, multiplexer circuit 501).

TABLE 2

| IA_ENB | SRAM_PU | SRAM_PD | MUX_OUT | MODES |
|---|---|---|---|---|
| 1 | X | X | 0 | During power-up |
| 0 | 0 | 0 | 0 | Blank device |
| 0 | 1 | 1 | 1 | PU is On, PD is Off |
| 0 | 0 | 0 | 0 | PU is Off, PD is On |
| 0 | 0 | 1 | In_# | Both PU and PD are Off |
| 0 | 1 | 0 |  | NOT PERMITTED |

During power-up, the circuit is disabled by setting enable signal IA_ENB high. Regardless of the initial values of memory cells SRAM_PU and SRAM_PD, pull-up PU is disabled (off), while pull-down PD is enabled (on), and signal MUX_OUT goes low.

In a blank device, the circuit is enabled by setting enable signal IA_ENB low. However, the contents of all memory cells are low. Therefore, none of transistors T_0–T_m is on (i.e., multiplexer circuit 501 does not drive output terminal MUX_OUT), pull-up PU is disabled, and pull-down PD is enabled. Signal MUX_OUT is low.

After configuration, if memory cells SRAM_PU and SRAM_PD both store high values, pull-up PU is enabled, and pull-down PD is disabled. Signal MUX_OUT is high. If memory cells SRAM_PU and SRAM_PD both store low values, pull-up PU is disabled, and pull-down PD is enabled. Signal MUX_OUT is low. In both of these cases, care should be taken not to configure multiplexer circuit 501 to drive signal MUX_OUT to an opposing value, because that would cause contention on the output terminal MUX_OUT.

If memory cell SRAM_PU stores a low value and memory cell SRAM_PD stores a high value, both pull-up PU and pull-down PD are off. The value on terminal MUX_OUT is supplied by multiplexer circuit 501 and controlled by memory cells SRAM_0–SRAM_m. It is not supported to load a high value into memory cell SRAM_PU and a low value into memory cell SRAM_PD, because both pull-up PU and pull-down PD would be enabled, causing contention at output terminal MUX_OUT.

Figure 6:
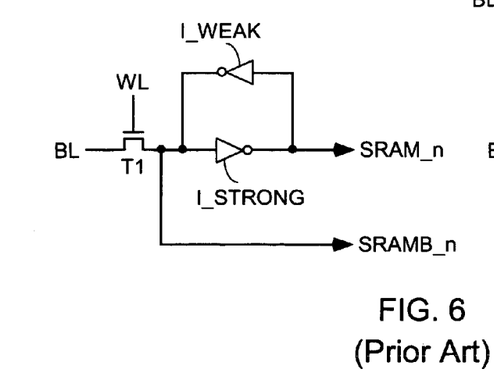
FIG. 6 shows a first configuration memory cell commonly used in PLDs.

The circuit of FIG. 5 functions well when used with the 5-transistor memory cell illustrated in FIG. 6. The memory cell of FIG. 6 includes one weak inverter I_WEAK and one strong inverter I_STRONG. This memory cell has the advantage of being easy to flip by writing a new value through transistor T1, because node SRAMB_n is driven by the weak inverter I_WEAK. However, the inverted memory cell output signal (SRAMB_n) is not very powerful, and it is already heavily loaded by driving the more powerful inverter I_STRONG, which has larger transistors. Therefore, inverters I_0–I_m, SPU, and SPD in the circuit of FIG. 5 are useful in overcoming this weakness.

Figure 7:
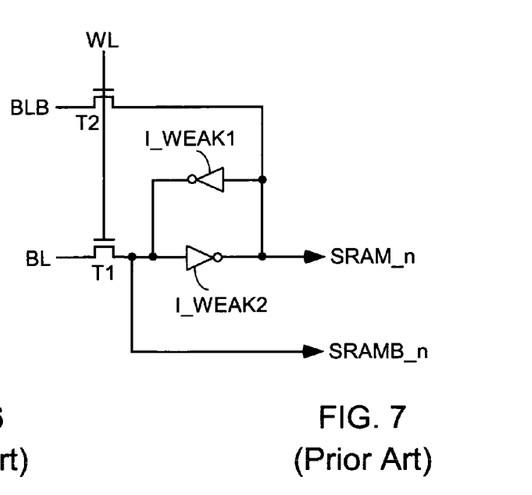
FIG. 7 shows a second configuration memory cell commonly used in PLDs.

However, some PLDs use the 6-transistor memory cell shown in FIG. 7. The memory cell of FIG. 7 includes two weak inverters (I_WEAK1, I_WEAK2), e.g., two inverters that include minimum-sized transistors. Neither transistor is more heavily loaded within the memory cell, so either output signal can be used to drive an external circuit. Therefore, the extra inverters (I_0–I_m, SPU, and SPD) are not needed. The circuit of FIG. 5 can therefore be simplified as shown in FIG. 8.

Figure 8:
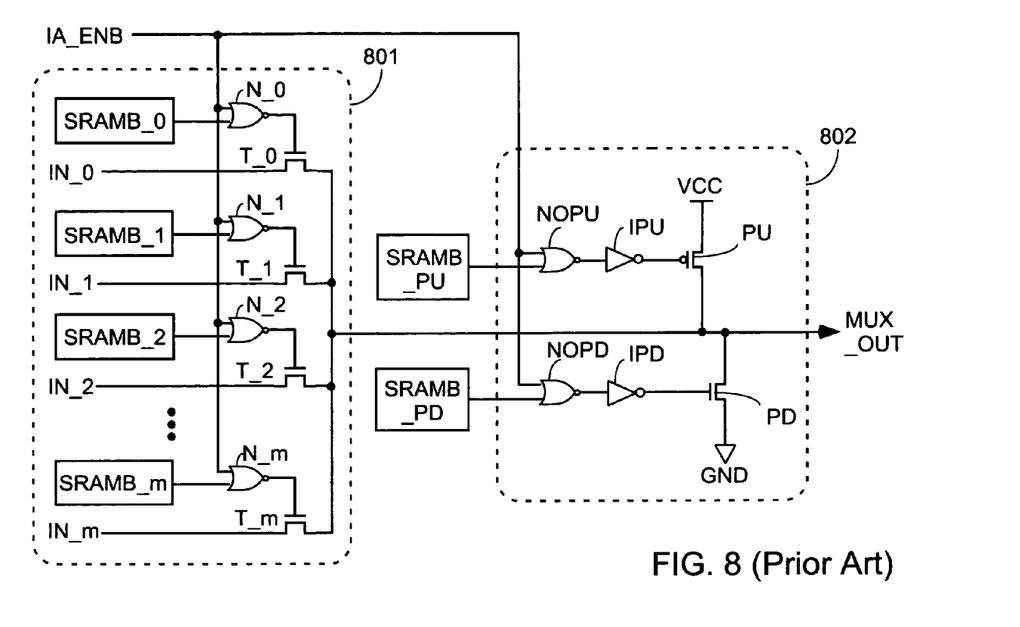
FIG. 8 shows a third known power-up and enable control circuit that can be used in a PLD interconnection array.

The control circuit of FIG. 8 is similar to that of FIG. 5, except that inverters I_0–I_m, SPU, and SPD have been removed and inverted values from the configuration memory cells are used. (The name SRAMB_x as applied to a memory cell in the present application implies that the inverse output of the memory cell is used rather than the true value, as was the case for memory cell SRAM_x.) Table 3 shows the functionality of the control circuit of FIG. 8. Note that in Table 3, a value of "1" specified for memory cell SRAMB_PU, for example, means that the inverted output signal is high. Therefore, when a value of "1" is specified, the memory cell actually stores a low value, e.g., in a blank device after power-up.

TABLE 3

| IA_ENB | SRAMB_PU | SRAMB_PD | MUX_OUT | MODES |
|---|---|---|---|---|
| 1 | X | X | 0 | During power-up |
| 0 | 1 | 1 | 0 | Blank device |
| 0 | 0 | 0 | 1 | PU is On, PD is Off |
| 0 | 1 | 1 | 0 | PU is Off, PD is On |
| 0 | 1 | 0 | In_# | Both PU and PD are Off |
| 0 | 0 | 1 | | NOT PERMITTED |

Figure 9:
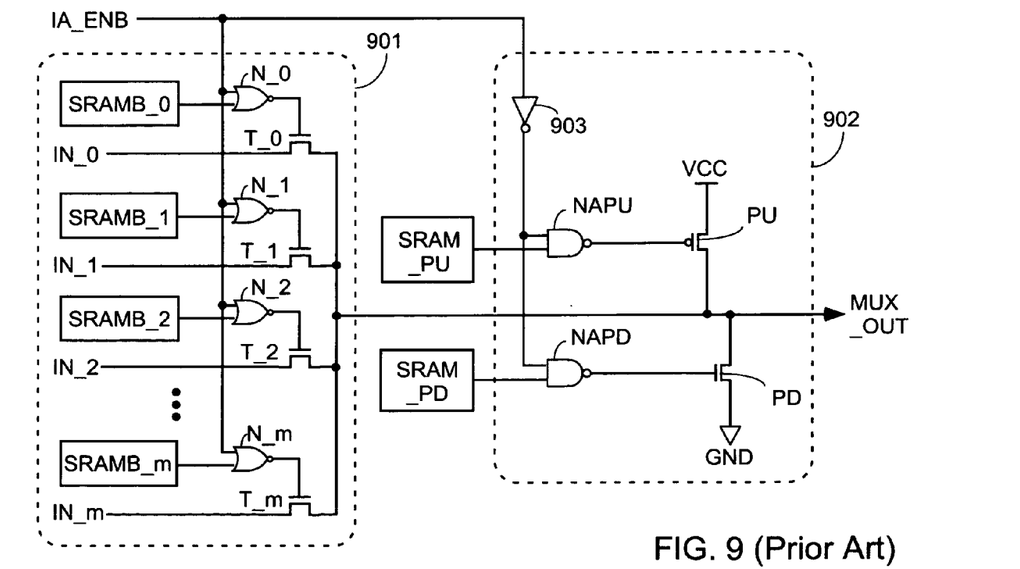
FIG. 9 shows a fourth known power-up and enable control circuit that can be used in a PLD interconnection array.

FIG. 9 illustrates another known control circuit for a PLD interconnection array. The circuit of FIG. 9 is similar to the circuit of FIG. 8, but requires two fewer transistors to implement. Note that the CMOS implementation of power-up and enable portion 802 (FIG. 8) uses 14 transistors, while the CMOS implementation of corresponding portion 902 (FIG. 9) uses 12 transistors. NOR gates NOPU and NOPD and inverters IPU and IPD are replaced by NAND gates NAPU and NAPD, while the inputs to this portion of the circuit are inverted by using the true, rather than the inverse, values from memory cells SRAM_PU and SRAM_PD. The enable signal is inverted by inverter 903. The functionality of the control circuit of FIG. 9 is the same as that of the circuit shown in FIG. 5. Therefore, the functionality of the control circuit of FIG. 9 is shown in Table 2.

PLD interconnection arrays typically include large numbers of power-up and enable control circuits. Thus, area savings in these circuits can translate to significant area savings in the PLD overall, thereby reducing the cost of the device. Therefore, it is desirable to provide area-efficient power-up and enable control circuits in the interconnection arrays of PLDs.

SUMMARY OF THE INVENTION

The invention provides area-efficient power-up and enable control circuits that can be used, for example, in PLD interconnection arrays. Compared to prior art circuits that use 12 or 14 transistors in addition to the driver circuit and memory cells, the circuits of the invention use as few as four transistors to provide similar functionality.

According to a first embodiment, a control circuit includes an enable input terminal, a control circuit output terminal, a pull-up control input terminal, a pull-down control input terminal, a driver circuit, first and second pull-ups, and first and second pull-downs. The driver circuit has an output terminal coupled to the control circuit output terminal. The first and second pull-ups are coupled in series between the control circuit output terminal and a power high, the first pull-up having a gate terminal coupled to the enable input terminal and the second pull-up having a gate terminal coupled to the pull-up control input terminal. The first and second pull-downs are coupled in parallel between the control circuit output terminal and a ground, the first pull-down having a gate terminal coupled to the enable input terminal and the second pull-down having a gate terminal coupled to the pull-down control input terminal. In some embodiments, the first and second pull-ups are P-channel transistors and the first and second pull-downs are N-channel transistors.

In some embodiments, the enable input terminal provides an active-low enable signal for the control circuit such that when the enable signal is high the control circuit output terminal consistently provides a low value. In some embodiments, the enable input terminal provides an active-high enable signal for the control circuit such that when the enable signal is low the control circuit output terminal consistently provides a high value.

In some embodiments, the driver circuit is a multiplexer circuit. In some of these embodiments, the multiplexer circuit forms a portion of a programmable interconnection array in a programmable logic device (PLD), e.g., a field programmable gate array (FGPA) or a complex programmable logic device (CPLD). In some of these embodiments, the control circuit further includes first and second configuration memory cells respectively coupled to the pull-up control input terminal and the pull-down control input terminal. In some embodiments, prior to configuration of the PLD the first and second configuration memory cells provide high values to the pull-up control input terminal and the pull-down control input terminal, and the control circuit output terminal provides a low value. In other embodiments, prior to configuration of the PLD the first and second configuration memory cells provide low values to the pull-up control input terminal and the pull-down control input terminal, and the control circuit output terminal provides a high value.

According to another embodiment of the invention, a control circuit includes an enable input terminal, a control circuit output terminal, a pull-up control input terminal, a pull-down control input terminal, a driver circuit, first and second pull-ups, and first and second pull-downs. The driver circuit has an output terminal coupled to the control circuit output terminal. The first and second pull-ups are coupled in parallel between the control circuit output terminal and a power high, the first pull-up having a gate terminal coupled to the enable input terminal and the second pull-up having a gate terminal coupled to the pull-up control input terminal. The first and second pull-downs are coupled in series between the control circuit output terminal and a ground, the first pull-down having a gate terminal coupled to the enable input terminal and the second pull-down having a gate terminal coupled to the pull-down control input terminal.

According to another embodiment of the invention, a control circuit includes an enable input terminal; a control circuit output terminal; a pull-up control input terminal; a pull-down control input terminal; first and second internal nodes; a driver circuit; first, second, and third pull-ups; a first pull-down, and first and second pass-gates. The driver circuit has an output terminal coupled to the control circuit output terminal. The first pull-up is coupled between the control circuit output terminal and a power high, and has a gate terminal coupled to the first internal node. The second pull-up is coupled between the first internal node and the power high, and has a gate terminal coupled to the enable input terminal. The first pass-gate is coupled between the first internal node and the pull-up control input terminal, and has a gate terminal coupled to the enable input terminal. The first pull-down is coupled between the control circuit output terminal and a ground, and has a gate terminal coupled to the second internal node. The third pull-up is coupled between the second internal node and the power high, and has a gate terminal coupled to the enable input terminal. The second pass-gate is coupled between the second internal node and the pull-down control input terminal, and has a gate terminal coupled to the enable input terminal.

In some embodiments, the first, second, and third pull-ups are P-channel transistors and the first pull-down is an N-channel transistor.

Other embodiments of the invention include PLDs having interconnection arrays that include control circuits such as those described above. These PLDs can be FPGAs, CPLDs, or other types of PLDs including PLDs yet to be developed.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 10:
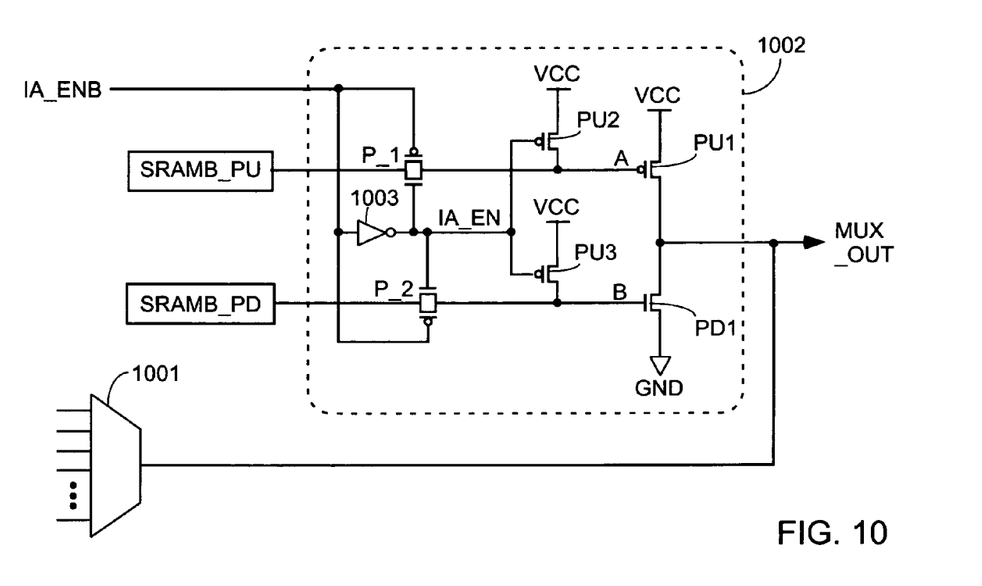
FIG. 10 shows a first power-up and enable control circuit according to an embodiment of the invention.

FIG. 10 shows a first power-up and enable control circuit according to an embodiment of the invention. The embodiment of FIG. 10 uses ten transistors in addition to the driver circuit 1001 and memory cells SRAMB_PU, SRAMB_PD. The power-up and enable portion 1002 includes two pass transistors (in the pictured embodiment CMOS pass transistors) P_1 and P_2; three pull-ups PU1–PU3; pull-down PD1, and an inverter 1003. Table 4 shows the functionality of the control circuit of FIG. 10. Note that in Table 4, a value of "1" specified for memory cell SRAMB_PU, for example, means that the inverted output signal is high. Therefore, when a value of "1" is specified, the memory cell actually stores a low value, e.g., in a blank device after power-up.

TABLE 4

| IA_ENB | SRAMB_PU | SRAMB_PD | MUX_OUT | MODES |
|---|---|---|---|---|
| 1 | X | X | 0 | During power-up |
| 0 | 1 | 1 | 0 | Blank device |
| 0 | 0 | 0 | 1 | PU1 is On, PD1 is Off |
| 0 | 1 | 1 | 0 | PU1 is Off, PD1 is On |
| 0 | 1 | 0 | In_# | Both PU1 and PD1 are Off |
| 0 | 0 | 1 |  | NOT PERMITTED |

During power-up, the circuit is disabled by setting enable signal IA_ENB high. Pass transistors P_1 and P_2 are both disabled, so the contents of memory cells SRAMB_PU and SRAMB_PD are ignored. Signal IA_EN (provided from signal IA_ENB by inverter 1003) is low. Therefore, both of pull-ups PU2, PU3 are enabled, pulling internal nodes A and B high. Thus, pull-up PU1 is turned off, while pull-down PD1 is turned on, pulling signal MUX_OUT low. Meanwhile, driver circuit 1001 is also preferably disabled (e.g., using signal IA_ENB as shown in FIGS. 5, 8, and 9) to avoid contention on output terminal MUX_OUT.

In the pictured embodiment, driver circuit 1001 can be, for example, a multiplexer circuit similar to multiplexer circuits 501, 801, and 901. In other embodiments, other driver circuits are used, e.g., tri-state buffers controlled by the enable signal. Memory cells SRAMB_PU and SRAMB_PD can be, for example, either of the memory cells shown in FIGS. 6 and 7. However, in some embodiments other memory cells are used.

In a blank device, the circuit is enabled by setting enable signal IA_ENB low. Pull-ups PU2 and PU3 are disabled. However, the contents of all memory cells are low (i.e., the inverse output signals of the memory cells are high). Therefore, pass transistors P_1 and P_2 are both enabled and passing high values to internal nodes A and B. Therefore, nodes A and B are both high. Pull-up PU1 is disabled, while pull-down PD1 is enabled. Therefore, node MUX_OUT is low. Meanwhile, driver circuit 1001 is preferably not providing a conflicting value. For example, if driver circuit 1001 is implemented as a multiplexer circuit such as those shown in any of FIGS. 4, 5, 8, and 9, the low values stored in the memory cells in a blank device ensure that driver circuit 1001 is not driving output terminal MUX_OUT.

After configuration, enable signal IA_ENB remains low. Therefore, pass transistors P_1 and P_2 are both enabled, and pull-ups PU2 and PU3 are both disabled. If memory cells SRAMB_PU and SRAMB_PD both store high values (i.e., the inverse values from the memory cells are both low), pull-up PU1 is enabled, and pull-down PD1 is disabled. Therefore, signal MUX_OUT is high. If memory cells SRAMB_PU and SRAMB_PD both store low values (i.e., the inverse values from the memory cells are both high), pull-up PU1 is disabled, and pull-down PD1 is enabled. Signal MUX_OUT is low. In both of these cases, care should be taken not to configure driver circuit 1001 to drive signal MUX_OUT to an opposing value, because that would cause contention on the output terminal MUX_OUT.

If memory cell SRAMB_PU stores a low value and memory cell SRAMB_PD stores a high value, both pull-up PU1 and pull-down PD1 are off. The value on terminal MUX_OUT is supplied by driver circuit 1001. It is not supported to load a high value into memory cell SRAMB_PU and a low value into memory cell SRAMB_PD, because both pull-up PU1 and pull-down PD1 would be enabled, causing contention at output terminal MUX_OUT.

Note that the control circuit of FIG. 10 has the same functionality as the control circuit of FIG. 8. In other words, Table 4 is the same as Table 3. However, the control circuit of FIG. 10 includes ten transistors in addition to the driver circuit and the memory cells, while the control circuit of FIG. 8 includes 14 transistors in addition to the driver circuit and the memory cells.

Figure 11:
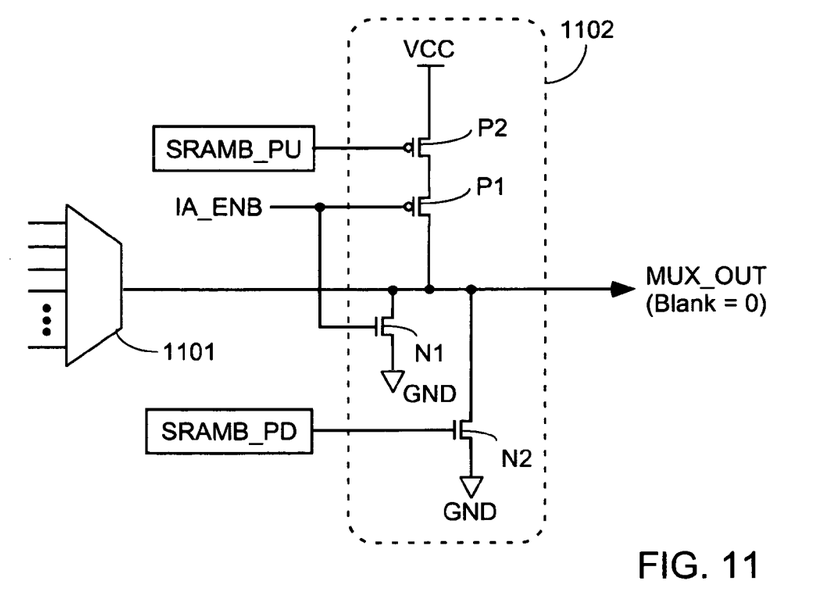
FIG. 11 shows a second power-up and enable control circuit according to an embodiment of the invention.

FIG. 11 shows a second power-up and enable circuit according to an embodiment of the invention. The control circuit of FIG. 11 has the same functionality as the control circuits of FIGS. 8 and 10. Therefore, the functionality of the control circuit of FIG. 11 is shown in Table 4. However, the control circuit of FIG. 11 includes only four transistors in addition to the driver circuit 1101 and memory cells SRAMB_PU, SRAMB_PD.

The power-up and enable portion 1102 of the control circuit includes two pull-ups P1 and P2 coupled in series and two pull-downs N1 and N2 coupled in parallel. In the pictured embodiment, pull-ups P1 and P2 are implemented as P-channel transistors, and pull-downs N1 and N2 are implemented as N-channel transistors. In other embodiments, other types of pull-ups and pull-downs can be used.

During power-up, the circuit is disabled by setting enable signal IA_ENB high. Pull-up P1 is off, so the contents of memory cell SRAMB_PU are ignored. Pull-down N1 is on, pulling output terminal MUX_OUT low regardless of the value stored in memory cell SRAMB_PD. Meanwhile, driver circuit 1101 is also preferably disabled (e.g., using signal IA_ENB as shown in FIGS. 5, 8, and 9) to avoid contention on output terminal MUX_OUT.

In the pictured embodiment, driver circuit 1101 can be, for example, a multiplexer circuit similar to multiplexer circuits 501, 801, and 901. In other embodiments, other driver circuits are used, e.g., tri-state buffers controlled by the enable signal. Memory cells SRAMB_PU and SRAMB_PD can be, for example, either of the memory cells shown in FIGS. 6 and 7. However, in some embodiments other memory cells are used.

In a blank device, the circuit is enabled by setting enable signal IA_ENB low. Pull-up P1 is on, and pull-down N1 is off. However, the contents of all memory cells are low (i.e., the inverse output signals of the memory cells are high). Therefore, pull-up P2 is off, while pull-down N2 is on, pulling output terminal MUX_OUT low. Meanwhile, driver circuit 1101 is preferably not providing a conflicting value. For example, if driver circuit 1101 is implemented as a multiplexer circuit such as those shown in any of FIGS. 4, 5, 8, and 9, the low values stored in the memory cells in a blank device ensure that driver circuit 1101 is not driving output terminal MUX_OUT.

After configuration, enable signal IA_ENB remains low. Therefore, pull-up P1 is on, and pull-down N1 is off. If memory cells SRAMB_PU and SRAMB_PD both store high values (i.e., the inverse values from the memory cells are both low), pull-up P2 is on, and pull-down N2 is off. Therefore, signal MUX_OUT is high. If memory cells SRAMB_PU and SRAMB_PD both store low values (i.e., the inverse values from the memory cells are both high), pull-up P2 is off, and pull-down N2 is on. Signal MUX_OUT is low. In both of these cases, care should be taken not to configure driver circuit 1101 to drive signal MUX_OUT to an opposing value, because that would cause contention on the output terminal MUX_OUT.

If memory cell SRAMB_PU stores a low value and memory cell SRAMB_PD stores a high value, both pull-up P2 and pull-down N2 are off. The value on terminal MUX_OUT is supplied by driver circuit 1101. It is not supported to load a high value into memory cell SRAMB_PU and a low value into memory cell SRAMB_PD, because both pull-up P2 and pull-down N2 would be enabled, causing contention at output terminal MUX_OUT.

Figure 12:
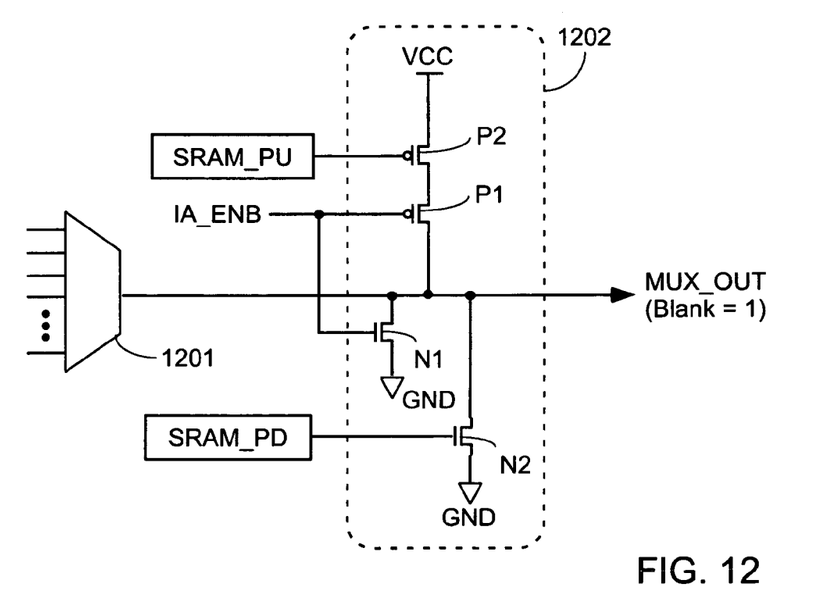
FIG. 12 shows a third power-up and enable control circuit according to an embodiment of the invention.

FIG. 12 shows another embodiment of the invention that also includes only four transistors in addition to the driver circuit 1201 and memory cells SRAM_PU, SRAM_PD. The control circuit of FIG. 12 is similar in structure to the circuit of FIG. 11, but uses the true values from the memory cells to control the pull-up P2 and pull-down N2. This difference also affects the functionality of the circuit. The functionality of the control circuit of FIG. 12 is shown in Table 5.

TABLE 5

| IA_ENB | SRAM_PU | SRAM_PD | MUX_OUT | MODES |
|---|---|---|---|---|
| 1 | X | X | 0 | During power-up |
| 0 | 0 | 0 | 1 | Blank device |
| 0 | 1 | 1 | 0 | N2 is On, P2 is Off |
| 0 | 0 | 0 | 1 | N2 is Off, P2 is On |
| 0 | 1 | 0 | In_# | Both N2 and P2 are Off |
| 0 | 0 | 1 |  | NOT PERMITTED |

The power-up and enable portion 1202 of the control circuit includes two pull-ups P1 and P2 coupled in series and two pull-downs N1 and N2 coupled in parallel. In the pictured embodiment, pull-ups P1 and P2 are implemented as P-channel transistors, and pull-downs N1 and N2 are implemented as N-channel transistors. In other embodiments, other types of pull-ups and pull-downs can be used.

During power-up, the circuit is disabled by setting enable signal IA_ENB high. Pull-up P1 is off, so the contents of memory cell SRAM_PU are ignored. Pull-down N1 is on, pulling output terminal MUX_OUT low regardless of the value stored in memory cell SRAM_PD. Meanwhile, driver circuit 1201 is also preferably disabled (e.g., using signal IA_ENB as shown in FIGS. 5, 8, and 9) to avoid contention on output terminal MUX_OUT.

In the pictured embodiment, driver circuit 1201 can be, for example, a multiplexer circuit similar to multiplexer circuits 501, 801, and 901. In other embodiments, other driver circuits are used, e.g., tri-state buffers controlled by the enable signal. Memory cells SRAM_PU and SRAM_PD can be, for example, either of the memory cells shown in FIGS. 6 and 7. However, in some embodiments other memory cells are used.

In a blank device, the circuit is enabled by setting enable signal IA_ENB low. Pull-up P1 is on, and pull-down N1 is off. However, the contents of all memory cells are low. Therefore, pull-down N2 is off, while pull-up P2 is on, pulling output terminal MUX_OUT high. Meanwhile, driver circuit 1201 is preferably not providing a conflicting value. For example, if driver circuit 1201 is implemented as a multiplexer circuit such as those shown in any of FIGS. 4, 5, 8, and 9, the low values stored in the memory cells in a blank device ensure that driver circuit 1201 is not driving output terminal MUX_OUT.

After configuration, enable signal IA_ENB remains low. Therefore, pull-up P1 is on, and pull-down N1 is off. If memory cells SRAM_PU and SRAM_PD both store high values, pull-up P2 is off, and pull-down N2 is on. Therefore, signal MUX_OUT is low. If memory cells SRAM_PU and SRAM_PD both store low values, pull-up P2 is on, and pull-down N2 is off. Signal MUX_OUT is high. In both of these cases, care should be taken not to configure driver circuit 1201 to drive signal MUX_OUT to an opposing value, because that would cause contention on the output terminal MUX_OUT.

If memory cell SRAM_PU stores a high value and memory cell SRAM_PD stores a low value, both pull-up P2 and pull-down N2 are off. The value on terminal MUX_OUT is supplied by driver circuit 1201. It is not supported to load a low value into memory cell SRAM_PU and a high value into memory cell SRAM_PD, because both pull-up P2 and pull-down N2 would be enabled, causing contention at output terminal MUX_OUT.

Figure 13:
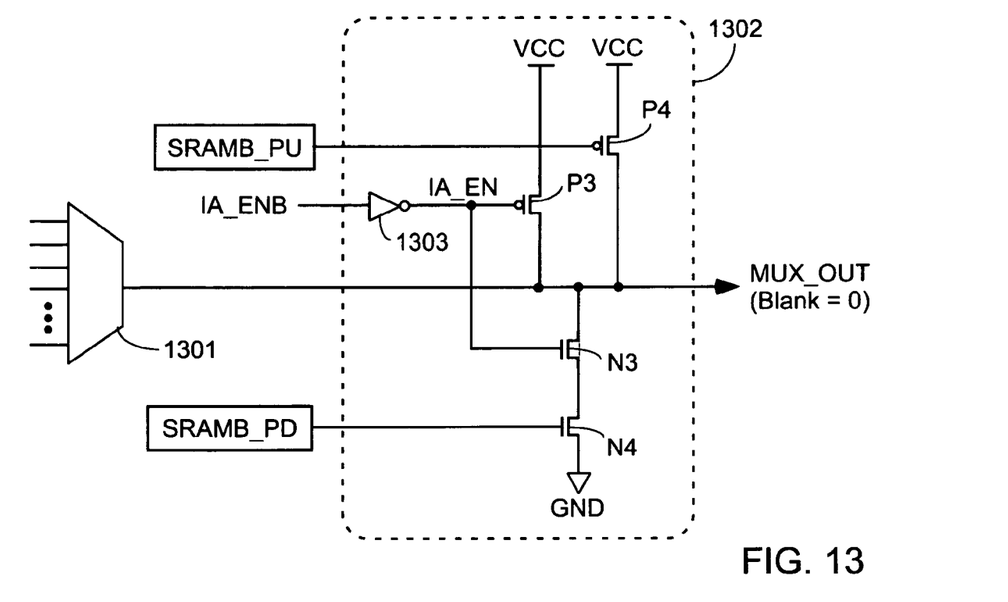
FIG. 13 shows a fourth power-up and enable control circuit according to an embodiment of the invention.

FIG. 13 shows another power-up and enable circuit according to another embodiment of the invention. When the active-low enable signal IA_ENB is provided, the embodiment of FIG. 13 uses six transistors in addition to the driver circuit 1301 and the memory cells SRAMB_PU and SRAMB_PD. However, if an active-high enable signal IA_EN is provided, only four transistors are needed in addition to the driver circuit and memory cells.

In the embodiment of FIG. 13, the output terminal MUX_OUT is high during power-up, and low for a blank device. The functionality of the control circuit of FIG. 13 is shown in Table 6.

TABLE 6

| IA_ENB | SRAMB_PU | SRAMB_PD | MUX_OUT | MODES |
|---|---|---|---|---|
| 1 | X | X | 1 | During power-up |
| 0 | 1 | 1 | 0 | Blank device |
| 0 | 0 | 0 | 1 | P4 is On, N4 is Off |
| 0 | 1 | 1 | 0 | P4 is Off, N4 is On |
| 0 | 1 | 0 | In_# | Both P4 and N4 are Off |
| 0 | 0 | 1 |  | NOT PERMITTED |

The power-up and enable portion 1302 of the control circuit includes two pull-ups P3 and P4 coupled in parallel and two pull-downs N3 and N4 coupled in series. In the pictured embodiment, pull-ups P3 and P4 are implemented as P-channel transistors, and pull-downs N3 and N4 are implemented as N-channel transistors. In other embodiments, other types of pull-ups and pull-downs can be used.

During power-up, the circuit is disabled by setting enable signal IA_ENB high or by setting enable signal IA_EN low. Pull-down N3 is off, so the contents of memory cell SRAMB_PD are ignored. Pull-up P3 is on, pulling output terminal MUX_OUT high regardless of the value stored in memory cell SRAMB_PU. Meanwhile, driver circuit 1301 is also preferably disabled (e.g., using signal IA_ENB as shown in FIGS. 5, 8, and 9) to avoid contention on output terminal MUX_OUT.

In the pictured embodiment, driver circuit 1301 can be, for example, a multiplexer circuit similar to multiplexer circuits 501, 801, and 901. In other embodiments, other driver circuits are used, e.g., tri-state buffers controlled by the enable signal. Memory cells SRAMB_PU and SRAMB_PD can be, for example, either of the memory cells shown in FIGS. 6 and 7. However, in some embodiments other memory cells are used.

In a blank device, the circuit is enabled by setting enable signal IA_ENB low or by setting enable signal IA_EN high. Pull-down N3 is on, and pull-up P3 is off. However, the contents of all memory cells are low (i.e., the inverse values from the memory cells are all high). Therefore, pull-up P4 is off, while pull-down N4 is on, pulling output terminal MUX_OUT low. Meanwhile, driver circuit 1301 is preferably not providing a conflicting value. For example, if driver circuit 1301 is implemented as a multiplexer circuit such as those shown in any of FIGS. 4, 5, 8, and 9, the low values stored in the memory cells in a blank device ensure that driver circuit 1301 is not driving output terminal MUX_OUT.

After configuration, enable signal IA_ENB remains low (enable signal IA_EN remains high). Therefore, pull-down N3 is on, and pull-up P3 is off. The circuit behaves in the same manner as the control circuit of FIG. 11, which was previously described in detail.

Figure 14:
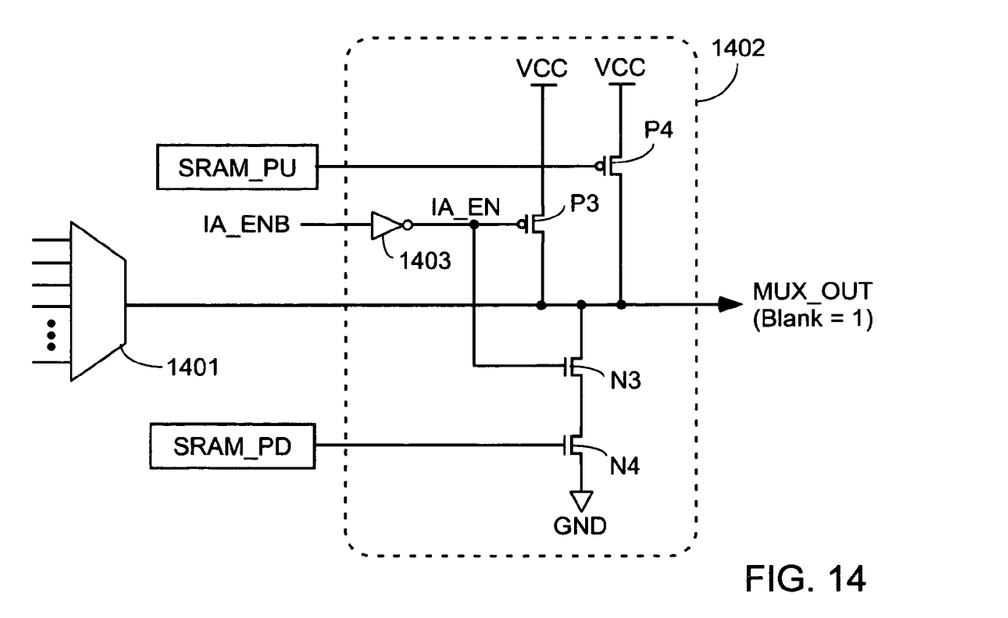
FIG. 14 shows a fifth power-up and enable control circuit according to an embodiment of the invention.

FIG. 14 shows another power-up and enable circuit according to an embodiment of the invention. The control circuit of FIG. 14 is similar in structure to the circuit of FIG. 13, but uses the true values from the memory cells to control the pull-up P4 and pull-down N4. This difference also affects the functionality of the circuit. In the embodiment of FIG. 14, the output terminal MUX_OUT is high during power-up, and remains high for a blank device. The functionality of the control circuit of FIG. 14 is shown in Table 7.

TABLE 7

| IA_ENB | SRAM_PU | SRAM_PD | MUX_OUT | MODES |
|---|---|---|---|---|
| 1 | X | X | 1 | During power-up |
| 0 | 0 | 0 | 1 | Blank device |
| 0 | 1 | 1 | 0 | N4 is On, P4 is Off |
| 0 | 0 | 0 | 1 | N4 is Off, P4 is On |
| 0 | 1 | 0 | In_# | Both N4 and P4 are Off |
| 0 | 0 | 1 |  | NOT PERMITTED |

The power-up and enable portion 1402 of the control circuit includes two pull-ups P3 and P4 coupled in parallel and two pull-downs N3 and N4 coupled in series. In the pictured embodiment, pull-ups P3 and P4 are implemented as P-channel transistors, and pull-downs N3 and N4 are implemented as N-channel transistors. In other embodiments, other types of pull-ups and pull-downs can be used.

During power-up, the circuit is disabled by setting enable signal IA_ENB high or by setting enable signal IA_EN low. Pull-down N3 is off, so the contents of memory cell SRAM_PD are ignored. Pull-up P3 is on, pulling output terminal MUX_OUT high regardless of the value stored in memory cell SRAM_PU. Meanwhile, driver circuit 1401 is also preferably disabled (e.g., using signal IA_ENB as shown in FIGS. 5, 8, and 9) to avoid contention on output terminal MUX_OUT.

In the pictured embodiment, driver circuit 1401 can be, for example, a multiplexer circuit similar to multiplexer circuits 501, 801, and 901. In other embodiments, other driver circuits are used, e.g., tri-state buffers controlled by the enable signal. Memory cells SRAM_PU and SRAM_PD can be, for example, either of the memory cells shown in FIGS. 6 and 7. However, in some embodiments other memory cells are used.

In a blank device, the circuit is enabled by setting enable signal IA_ENB low or by setting enable signal IA_EN high. Pull-down N3 is on, and pull-up P3 is off. However, the contents of all memory cells are low. Therefore, pull-down N4 is off, while pull-up P4 is on, pulling output terminal MUX_OUT high. Meanwhile, driver circuit 1401 is preferably not providing a conflicting value. For example, if driver circuit 1401 is implemented as a multiplexer circuit such as those shown in any of FIGS. 4, 5, 8, and 9, the low values stored in the memory cells in a blank device ensure that driver circuit 1401 is not driving output terminal MUX_OUT.

After configuration, enable signal IA_ENB remains low (enable signal IA_EN remains high). Therefore, pull-down N3 is on, and pull-up P3 is off. The circuit behaves in the same manner as the control circuit of FIG. 12, which was previously described in detail.

Those having skill in the relevant arts of the invention will now perceive various modifications and additions that can be made as a result of the disclosure herein. For example, the above text describes the circuits of the invention in the context of multiplexer circuits included in interconnection arrays of programmable logic devices (PLDs), such as FPGAs and CPLDs. However, the circuits of the invention can be implemented using driver circuits other than multiplexer circuits, and can be applied to portions of PLD other than interconnection arrays. Further, the circuits of the invention can also be implemented in other integrated circuits, including non-programmable logic devices. The circuits of the invention can also be implemented in other electronic systems, for example, in printed circuit boards including discrete devices.

Further, pull-ups, pull-downs, transistors, P-channel transistors, N-channel transistors, driver circuits, multiplexer circuits, pass-gates, inverters, and other components other than those described herein can be used to implement the invention. Active-low signals can be replaced with active-high signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A control circuit, comprising:
   an enable input terminal;
   a control circuit output terminal;
   a pull-up control input terminal;
   a pull-down control input terminal;
   a first internal node;
   a second internal node;
   a driver circuit having an output terminal coupled to the control circuit output terminal;
   a first pull-up coupled between the control circuit output terminal and a power high, the first pull-up having a gate terminal coupled to the first internal node;
   a second pull-up coupled between the first internal node and the power high, the second pull-up having a gate terminal coupled to the enable input terminal;
   a first pass-gate coupled between the first internal node and the pull-up control input terminal, the first pass-gate having a gate terminal coupled to the enable input terminal;
   a first pull-down coupled between the control circuit output terminal and a ground, the first pull-down having a gate terminal coupled to the second internal node;
   a third pull-up coupled between the second internal node and the power high, the third pull-up having a gate terminal coupled to the enable input terminal; and
   a second pass-gate coupled between the second internal node and the pull-down control input terminal, the second pass-gate having a gate terminal coupled to the enable input terminal.

2. The control circuit of claim 1, wherein the first, second, and third pull-ups are P-channel transistors and the first pull-down is an N-channel transistor.

3. The control circuit of claim 1, wherein the enable input terminal provides an active-low enable signal for the control circuit such that when the enable signal is high the control circuit output terminal consistently provides a low value.

4. The control circuit of claim 1, wherein the driver circuit comprises an enable terminal coupled to the enable input terminal of the control circuit.

5. The control circuit of claim 1, wherein the driver circuit is a multiplexer circuit.

6. The control circuit of claim 5, wherein the multiplexer circuit comprises a portion of a programmable interconnection array in a programmable logic device (PLD).

7. The control circuit of claim 6, wherein the PLD is one of a field programmable gate array (FGPA) and a complex programmable logic device (CPLD).

8. The control circuit of claim 6, further comprising first and second configuration memory cells respectively coupled to the pull-up control input terminal and the pull-down control input terminal.

9. The control circuit of claim 8, wherein prior to configuration of the PLD the first and second configuration memory cells provide high values to the pull-up control input terminal and the pull-down control input terminal, and the control circuit output terminal provides a low value.

10. A programmable logic device (PLD), comprising:
    a plurality of logic blocks;
    a plurality of configuration memory cells; and an interconnection array programmably interconnecting the logic blocks, the interconnection array comprising a plurality of interconnect lines and a plurality of control circuits, each control circuit comprising:
an enable input terminal;
a control circuit output terminal coupled to at least one of the interconnect lines;
a pull-up control input terminal coupled to one of the plurality of configuration memory cells;
a pull-down control input terminal coupled to another of the plurality of configuration memory cells;
a first internal node;
a second internal node;
a multiplexer circuit having an output terminal coupled to the control circuit output terminal and a plurality of input terminals coupled to a subset of the plurality of interconnect lines;
a first pull-up coupled between the control circuit output terminal and a power high, the first pull-up having a gate terminal coupled to the first internal node;
a second pull-up coupled between the first internal node and the power high, the second pull-up having a gate terminal coupled to the enable input terminal;
a first pass-gate coupled between the first internal node and the pull-up control input terminal, the first pass-gate having a gate terminal coupled to the enable input terminal;
a first pull-down coupled between the control circuit output terminal and a ground, the first pull-down having a gate terminal coupled to the second internal node;
a third pull-up coupled between the second internal node and the power high, the third pull-up having a gate terminal coupled to the enable input terminal; and
a second pass-gate coupled between the second internal node and the pull-down control input terminal, the second pass-gate having a gate terminal coupled to the enable input terminal.

11. The PLD of claim 10, wherein the PLD is one of a field programmable gate array (FPGA) and a complex programmable logic device (CPLD).

\* \* \* \* \*